United States Patent [19]
Yang et al.

[11] Patent Number: 5,888,674
[45] Date of Patent: Mar. 30, 1999

[54] METHOD OF MANUFACTURING A HALFTONE PHASE SHIFT MASK

[75] Inventors: Hyun Jo Yang, Chungcheongbuk-do; Byung Chan Kim, Kyungki-do, both of Rep. of Korea

[73] Assignee: LG Semicon Co., Ltd., Chungcheongbuk-do, Rep. of Korea

[21] Appl. No.: 679,141

[22] Filed: Jul. 12, 1996

[30] Foreign Application Priority Data

Apr. 12, 1996 [KR] Rep. of Korea ................... 1996 11063

[51] Int. Cl.$^6$ ....................................................... G03F 9/00
[52] U.S. Cl. ................................................................ 430/5
[58] Field of Search ............................... 430/5, 322, 323, 430/324

[56] References Cited

U.S. PATENT DOCUMENTS 5,536,602  7/1996  Nakao ........................................ 430/5
5,591,550  1/1997  Choi et al. .................................. 430/5

OTHER PUBLICATIONS

Yong K. Choi et al., Advanced Process Technology Department, LG Semicon Co., Optical Proximity Correction on Attenuated Phase Shifting Photo Mask for Dense Contact Array, pp. 328–332 and 334–338/SPIE vol. 2440 Feb. 1995.

*Primary Examiner*—S. Rosasco

[57] ABSTRACT

A halftone phase shift mask includes a substrate, a first light-shielding layer formed in one region of the substrate for shielding light between a plurality of key patterns, and a second light-shielding layer formed in another region of the substrate for shielding light between a plurality of cell patterns, whereby a generation of sidelobe is prevented. A method of manufacturing a phase shift mask includes forming a first light-shielding layer on one region of a substrate, forming a second light-shielding layer on another region of the substrate and on the first light-shielding layer, and patterning the first and second light-shielding layers to thereby form a plurality of cell patterns and key patterns.

35 Claims, 9 Drawing Sheets

180°↓ intensity of light intensity of light

P/R

METHOD OF MANUFACTURING A HALFTONE PHASE SHIFT MASK

BACKGROUND OF THE INVENTION

The present invention relates to a method of manufacturing a phase shift mask, and more particularly, to a method of manufacturing a halftone phase shift mask.

In a general mask using a chrome film, a light-shielding layer for shielding light is selectively formed on a quartz or glass substrate. In a part where the light-shielding layer is not formed, light is transmitted with a uniform phase, whereas in a part where the light-shielding layer is formed, light is not transmitted.

Accordingly, in such a mask, the destruction and interference phenomena occur in the edge parts of the light-shielding layer, which reduces the size of the actual light-shielding region. Thus, it is difficult to form a desired pattern using the general mask.

In order to solve the disadvantages of such a general mask, a phase shift mask has been developed recently.

The phase shift mask compounds the phase of light being transmitted through the mask to 180° or 0° along the pattern arrangement, thereby removing the destruction and interference phenomena in the edge parts of the general mask.

Furthermore, among such phase shift masks, a halftone phase shift mask useful for improving the resolution limit of a contact hole has been developed.

This halftone phase shift mask is a mask in which the thickness of a light-shielding layer is formed very thinly so that the light-transmissivity of the light-shielding layer is 4–30%. Further, the halftone phase shift mask includes a phase shift film adhered thereto for shifting the phase of the light transmitting therethrough to 180°.

Hereinafter, a conventional halftone phase shift mask will be described with reference to the attached drawings.

To begin with, as shown in FIG. 1A, a transmissive substrate 1 such as a quartz or a glass is prepared. On the transmissive substrate 1, a halftone pattern material layer 2 ($Cr_2O_5$) of a predetermined thickness is formed to cause a phase shift.

At this time, the halftone pattern material layer 2 has a characteristic of shifting the phase of a light passing through to 180° and transmitting only 5–10% of the incident light.

Accordingly, in the open region of the halftone pattern material layer 2, light transmits through the transmissive substrate 1 so that the positive intensity profile of light is achieved as shown in FIG. 1A.

On the other hand, where the halftone pattern material layer 2 is formed, only 5–10% of the incident light is transmitted with the phase of light shifted to 180°, thereby showing a negative value. That is, the intensity profile as shown in FIG. 1B appears. Expressing the intensity profile in its absolute value, a profile as shown in FIG. 1C is realized.

FIG. 2 shows a construction of a conventional contact hole mask of a general DRAM. It includes a cell part 11 in the central region, an overlay monitor key part 12 in the edge region, and an alignment key part 13.

Here, when the halftone phase shift mask is used according to the conventional method, the sidelobe of small contact holes located in the cell part 11 is worth a little consideration. However, since a larger exposure energy is required to form large contact holes such as the alignment key part 13 or overlay monitor key part 12, the sidelobe of such large contact holes, which is proportional to the exposure energy, becomes large.

That is, in order to form the overlay monitor key part 12 and alignment key part 13 having large contact holes, the open region of the halftone pattern material layer should be larger than the size of the large contact holes. Then, this requires a large exposure energy for the masking. However, an increase in the exposure energy causes an increase in the size of the sidelobe.

FIGS. 3A to 3D show the pattern formation of a photoresist for forming an overlay monitor key and an alignment key using the conventional masking method.

To begin with, as shown in FIG. 3A, a halftone pattern material layer 22 is formed on a substrate 21 and then, patterned in accordance with the overlay monitor key pattern or the alignment key pattern, respectively.

At this time, as shown in FIG. 3B, light transmitting through an open region having no halftone pattern material layer 22 has a positive phase, whereas light transmitting through the halftone pattern material layer 22 has a negative phase. Expressing the intensity profile of light by its absolute value is as shown in FIG. 3C.

Here, since the transmissivity of light in the halftone pattern material layer 22 is 5–10%, the intensity profile of light shows a higher intensity for the open region than for the halftone layer 22. However, since the pattern desired to form is the overlay monitor key or alignment key pattern, the sidelobe attended by the halftone pattern material layer 22 is increased.

This is because the exposure energy increases if the pattern desired to form is large. By using a large exposure energy to form a large pattern, the size of the sidelobe also increases. Consequently, as shown in FIGS. 3D and 3E, the pattern of the photoresist is formed inaccurately, and the sidelobe 23 appears around the overlay monitor key or alignment key pattern.

Accordingly, the aforementioned method of manufacturing using the conventional halftone phase shift mask has the following problems.

First, the sidelobe of the masking material becomes large so that the overlay operation cannot be effectively monitored. Second, consequently in the subsequent step, alignment becomes impossible.

SUMMARY OF THE INVENTION

In order to correct the aforementioned problems, it is an object of the present invention to provide a method of manufacturing a phase shift mask in which the increase in the sidelobe is prevented to make accurate alignment.

In order to accomplish the above and other objects, there is provided a phase shift mask including a substrate, a first light-shielding part located in one region of the substrate and having a plurality of key patterns and shielding light between the key patterns, and a second light-shielding part located in the other region of the substrate and having a plurality of cell patterns and transmitting a portion of the light therethrough.

Further, there is provided a method of manufacturing a phase shift mask, including the steps of preparing a substrate, forming a first light-shielding layer on one region of the substrate, forming a second light-shielding layer on the other region of the substrate and on the first light-shielding layer, patterning the second light-shielding layer formed on the one region of the substrate to thereby form a plurality of cell patterns, and patterning the first light-shielding layer and the second light-shielding layer formed on the other region of the substrate to thereby form a plurality of key patterns.

At this time, the substrate is comprised of a light transmissive material. The first light-shielding layer shields light completely or partially. The second light-shielding layer shields light partially and shifts the phase of the light. The key pattern includes an overlay monitor key and an alignment key.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Briefly described, the present invention is directed to a halftone phase shift mask including a substrate, a first light-shielding layer formed on the substrate for shielding light between a plurality of key patterns, and a second light-shielding layer formed on the substrate for shielding light between a plurality of cell patterns, whereby a generation of sidelobe is prevented.

Furthermore, the present invention is directed to a method of manufacturing a phase shift mask, including the steps of forming a first light-shielding layer on a first region of a substrate, forming a second light-shielding layer on a second region of the substrate and on the first light-shielding layer, and patterning the first and second light-shielding layers to form a plurality of cell patterns and a plurality of key patterns in the first and second regions.

BRIEF DESCRIPTION OF THE ATTACHED DRAWINGS

The present invention will become more fully understood from the detailed description given hereinbelow and the accompanying drawings which are given by way of illustration only and, thus, are not limitative of the present invention, and wherein.

DETAILED DESCRIPTION OF THE PREFERRED EMBODIMENTS

Hereinafter, the structure and the manufacturing method of a halftone phase shift mask according to a first embodiment of the present invention will be described with reference to the attached drawings.

Figure 1A:
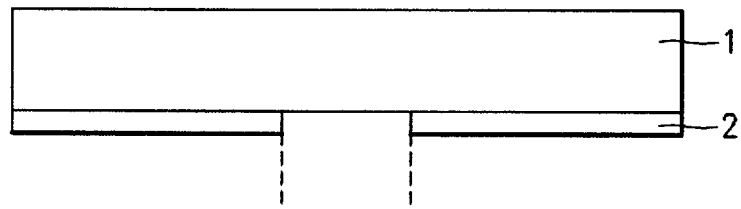
FIGS. 1A to 1C are diagrams showing a conventional halftone phase shift mask and the intensity profile of light attended thereby.
Figure 1B:
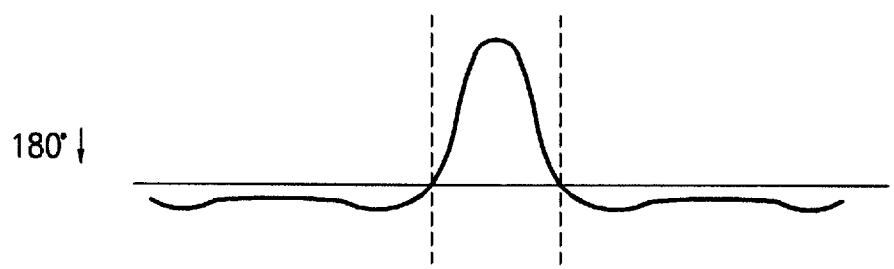
Figure 1C:
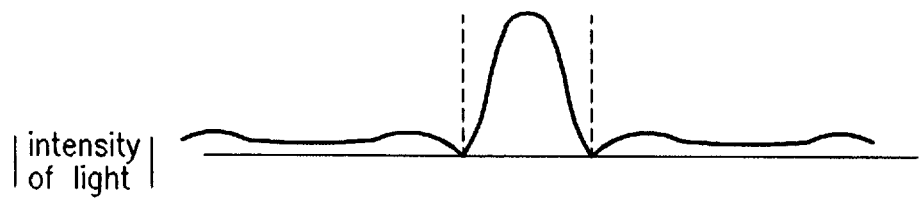
Figure 2:
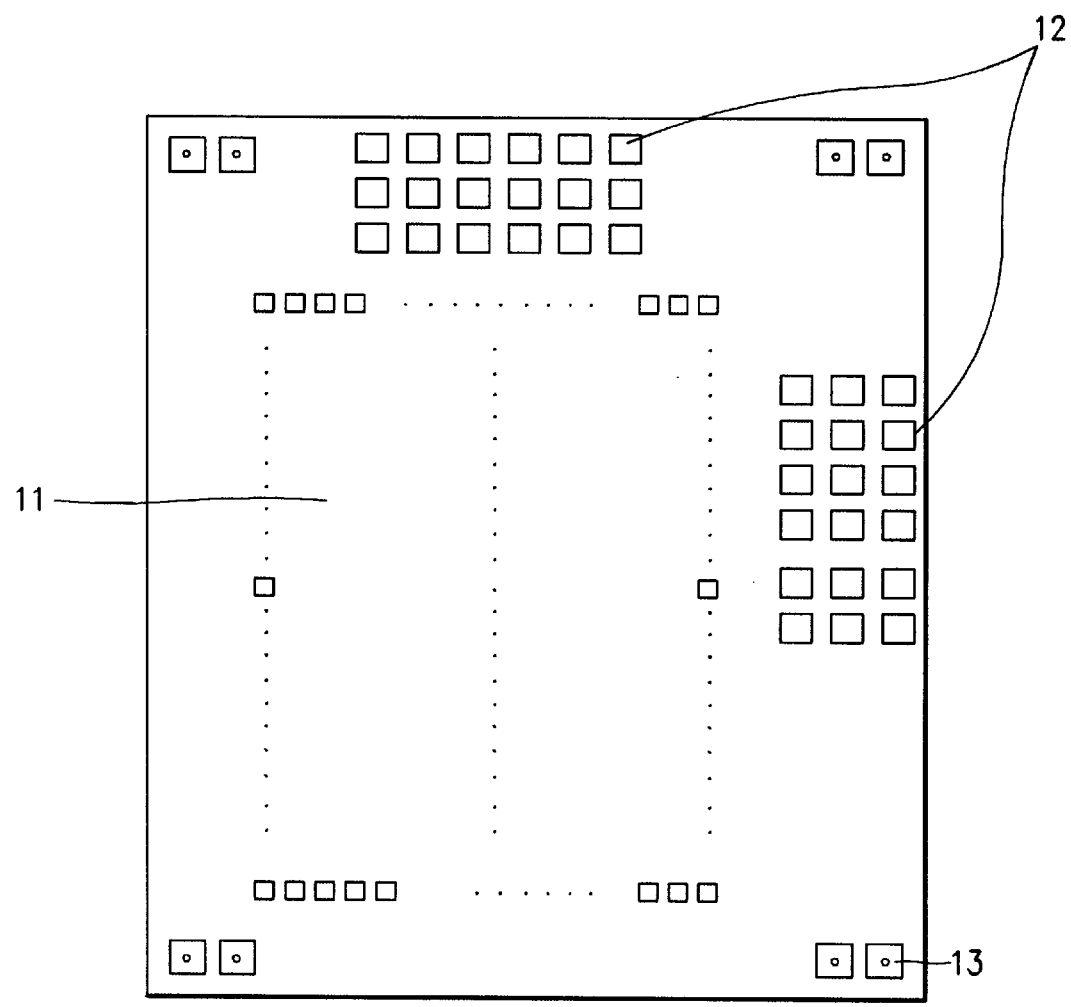
FIG. 2 is a plan view of a conventional general contact hole pattern mask.
Figure 3A:
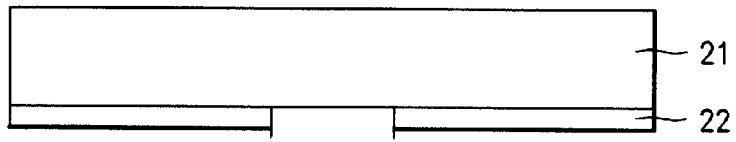
FIGS. 3A to 3E are diagrams showing a conventional general halftone phase shift mask and the pattern shape of a photoresist.
Figure 3B:
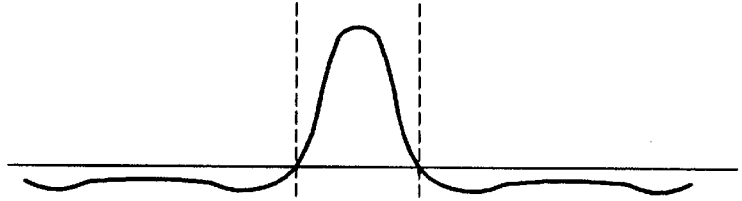
Figure 3C:
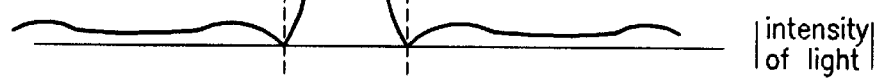
Figure 3D:
Figure 3E:
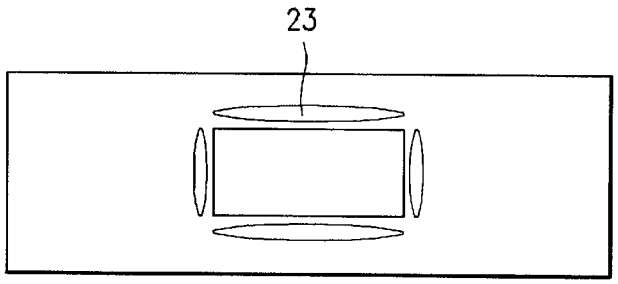
Figure 4:
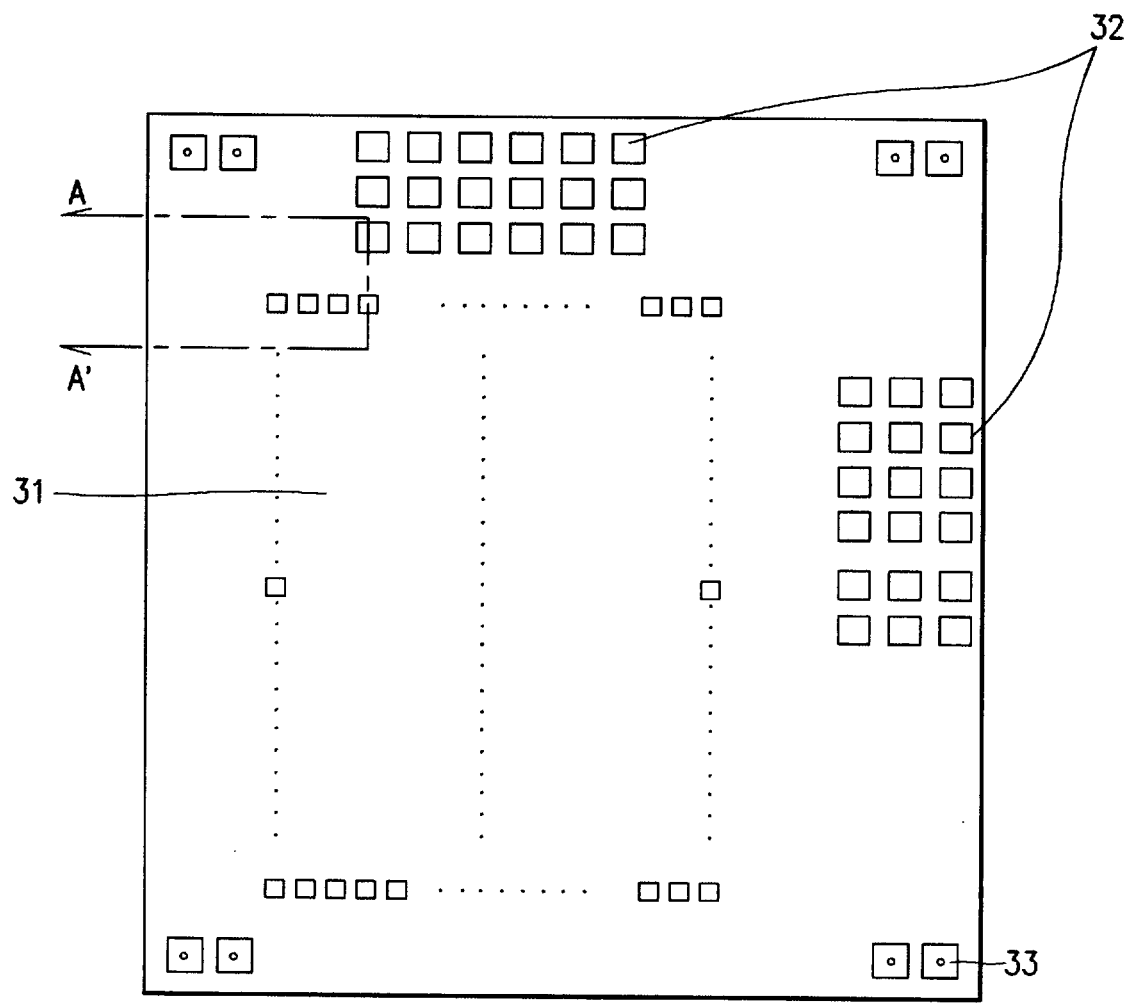
FIG. 4 is a plan view of a contact hole pattern mask for illustrating the embodiments of the present invention.
Figure 5:
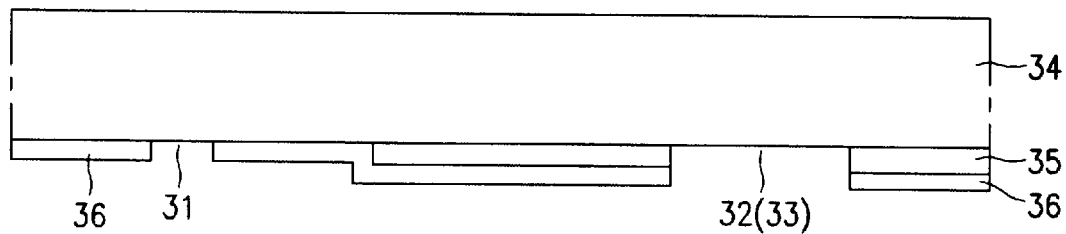
FIG. 5 is a cross-sectional view showing a structure of a halftone phase shift mask according to a first embodiment of the present invention.

A general contact hole pattern mask according to the first embodiment of the present invention is shown, e.g., in FIG. 4. FIG. 5 is a cross-sectional view of a halftone phase shift mask according to the first embodiments of the present invention, taken along line A–A' in FIG. 4.

Referring to FIG. 5, the halftone phase shift mask according to the first embodiment of the present invention includes an overlay monitor key pattern, an alignment key pattern, and a region where a cell pattern is to be formed. The mask further includes a substrate 34, a first light-shielding layer 35 formed on the substrate 34 excluding the region 31 where the cell pattern is to be formed and excluding the part of an overlay monitor key pattern 32 and an alignment key pattern 33, and a second light-shielding layer 36 formed on the first light-shielding layer 35 and the substrate 34.

Here, a quartz or glass substrate is used, for example, as the substrate 34. The first light-shielding layer 35 shields light completely. The second light-shielding layer 36 is comprised of any one of CrO, $Cr_2O_5$, CrON, SiN, WSi, MoSiO and MoSiON.

The second light-shielding layer 36 is formed to such a thickness being sufficient to shift the phase of light, and the transmissivity of light of the second light-shielding layer 36 is 5–10%.

A method of manufacturing the halftone phase shift mask having the aforementioned structure, according to the first embodiment of the present invention, will be described below.

FIGS. 6A to 6D are cross-sectional views for illustrating a method of manufacturing the halftone phase shift mask according to the first embodiment of the present invention.

Figure 6A:
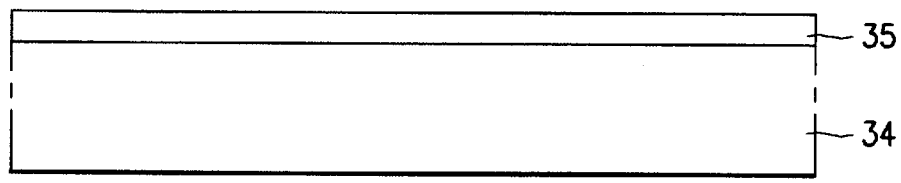
FIGS. 6A to 6D are cross-sectional views for explaining a method of manufacturing a halftone phase shift mask according to the first embodiment of the present invention.

As shown in FIG. 6A, chrome is deposited on the substrate 34 to form the first light-shielding layer 35. At this time, if the thickness of the chrome is thin, light is transmitted to some degree. Thus, a thick layer of chrome is then formed so that light is not transmitted at all.

Figure 6B:
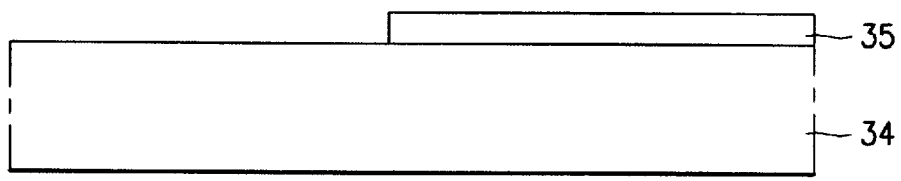
Figure 6C:
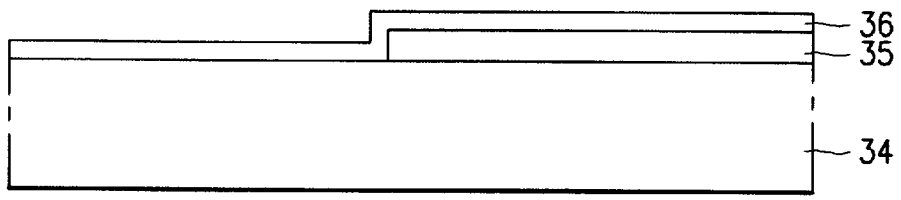

As shown in FIG. 6B, a portion of the first light-shielding layer 35 where a cell pattern is to be formed is removed selectively. Then, as shown in FIG. 6C, the second light-shielding layer 36 is formed on the substrate 34 over the first light-shielding layer 35.

Here, the second light-shielding layer 36 is comprised of any one of CrO, $Cr_2O_5$, CrON, SiN, WSi, MoSiO and MoSiON. The thickness of the second light-shielding layer 36 is controlled so that the phase of light is shifted and the transmissivity thereof is 5–10%.

Figure 6D:
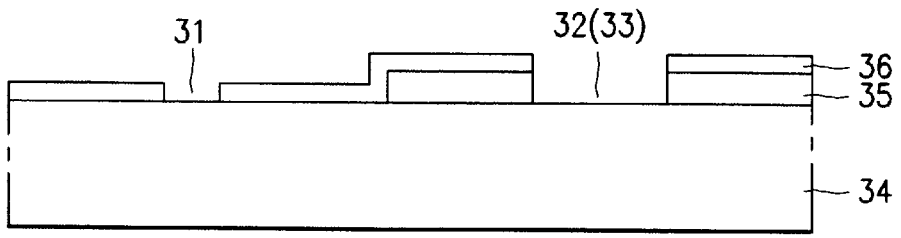

As shown in FIG. 6D, in order to form a cell pattern 31, the second light-shield layer 36 is removed selectively. Then, to form an overlay monitor key 32 and an alignment key pattern 33, the first light-shielding layer 35 and second light-shielding layer 36 are removed selectively. At this time, the first light-shielding layer 35 and second light-shielding layer 36 are removed simultaneously through an etching process.

Figure 7A:
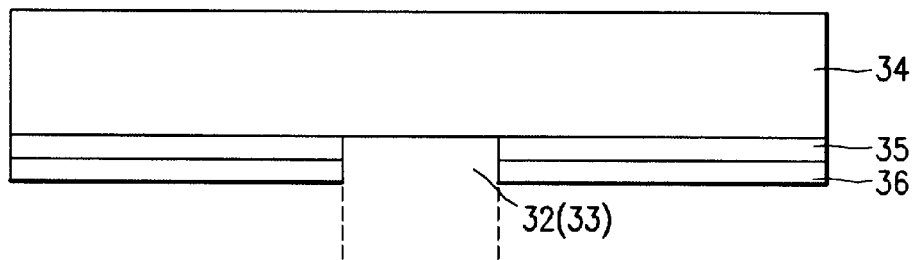
FIGS. 7A to 7C are diagrams showing the intensity profile of light and the pattern shape of a photoresist, with respect to the halftone phase shift mask according to the first embodiment of the present invention.
Figure 7B:
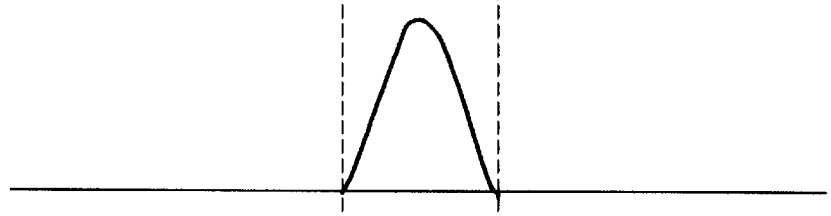
Figure 7C:
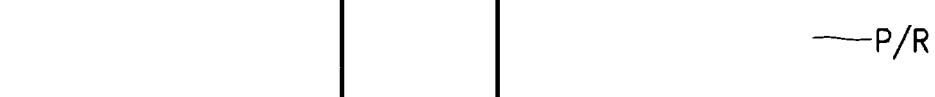

Meanwhile, FIGS. 7A to 7C show the intensity profile of light and the pattern shape of a photoresist near the overlay monitor key 32 and alignment key pattern 33, with respect to the halftone phase shift mask according to the first embodiment of the present invention.

More specifically, FIG. 7A shows the halftone phase shift mask for forming the overlay monitor key and the alignment key pattern. Though not shown, only a second planarizing layer (i.e., a phase shift layer) is formed on the substrate of the region where the cell pattern will be formed.

At this time, light incident through the open region 32 (33) as shown in FIG. 7A is transmitted. Since the first light-shielding layer 35 which completely shields light is formed on the substrate 34 except for the open region, light is transmitted only through the open region.

The intensity profile of light attended thereby is shown in FIG. 7B. Accordingly, as shown in FIG. 7C, an unnecessary loss of a photoresist due to exposure light is prevented, an accurate patterning of the photoresist is achieved, and the generation of sidelobes is prevented.

Referring to FIGS. 8–10C, a method of manufacturing a halftone phase shift mask according to a second embodiment of the present invention will be described below.

Figure 8:
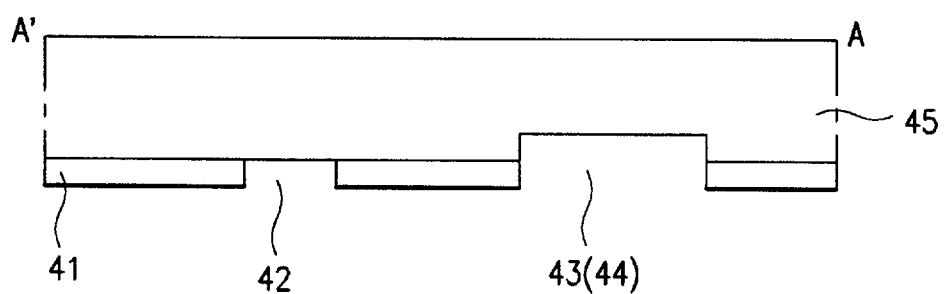
FIG. 8 is a cross-sectional view showing a structure of a halftone phase shift mask according to a second embodiment of the present invention.
Figure 9A:
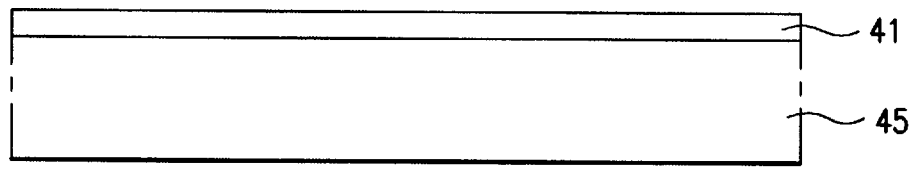
FIGS. 9A to 9C are cross-sectional views for explaining a method of manufacturing a halftone phase shift mask according to the second embodiment of the present invention.
Figure 9B:
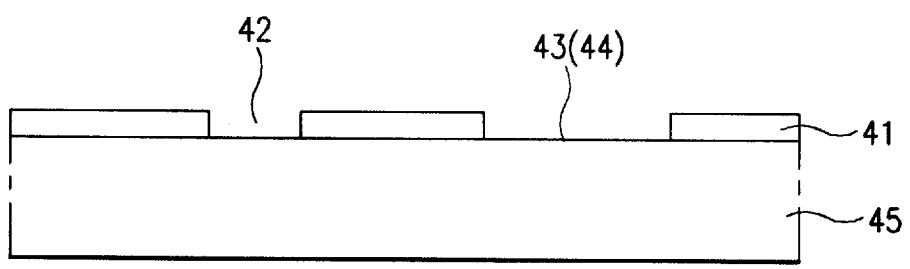
Figure 9C:
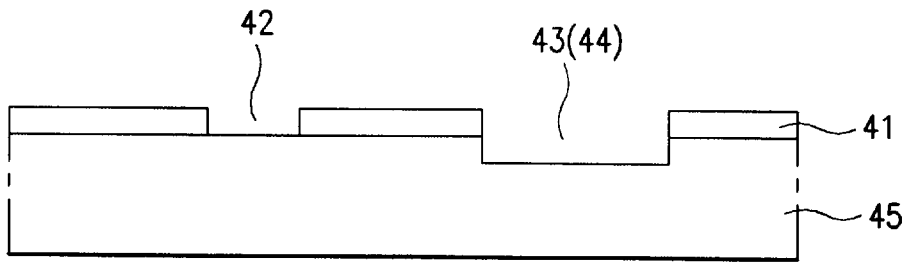

FIG. 8 is a cross-sectional view of a halftone phase shift mask according to the second embodiment, taken along line A–A' in FIG. 4. FIGS. 9A to 9C are cross-sectional views for illustrating a method of manufacturing the halftone phase shift mask according to the second embodiment of the present invention.

To begin with, the halftone phase shift mask according to the second embodiment of the present invention, as shown in FIG. 8, has a structure in which a substrate 45 is etched at where an overlay monitor key pattern 43 and an alignment key pattern 44 are to be formed. The size of the etched area is larger than the size of a cell pattern 42 patterned by a phase shift layer (41).

The method of manufacturing a halftone phase shift mask according to the second embodiment of the present invention is as follows.

As shown in FIG. 9A, a light-shielding layer 41 is formed on the substrate 45. At this time, a quartz or glass substrate is used, for example, as the substrate 45. The light-shielding layer 41 is comprised of any one of CrO, $Cr_2O_5$, CrON, SiN, WSi, MoSiO and MoSiON. The thickness of the light-shielding layer 41 is controlled so that the phase of light being transmitted therethrough is shifted and the transmissivity is 5–10%.

As shown in FIG. 9B, in order to form the cell pattern 42, the overlay monitor key pattern 43 and the alignment key pattern 44, the light-shielding layer 41 is removed selectively.

As shown in FIG. 9C, in order to prevent generation of a sidelobe when forming the overlay monitor key pattern 43 and alignment key pattern 44, the part of the substrate 45 on which the overlay monitor key pattern 43 and the alignment key pattern 44 are to be formed is etched to a predetermined depth. The etching depth of the substrate 45 is such that it is sufficient to shift the phase of light.

Figure 10A:
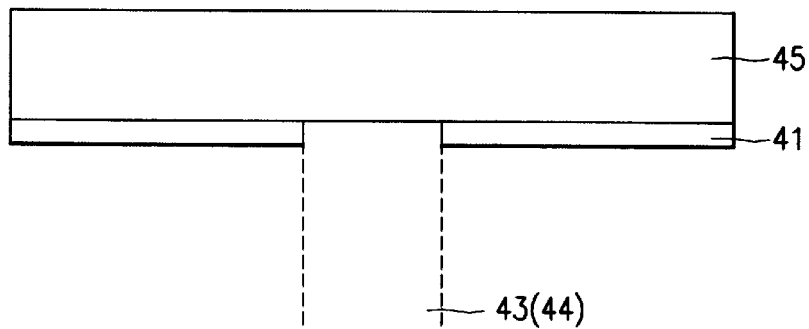
FIGS. 10A to 10C are diagrams showing the intensity profile of light and the pattern shape of a photoresist, with respect to the halftone phase shift mask according to the second embodiment of the present invention.
Figure 10B:
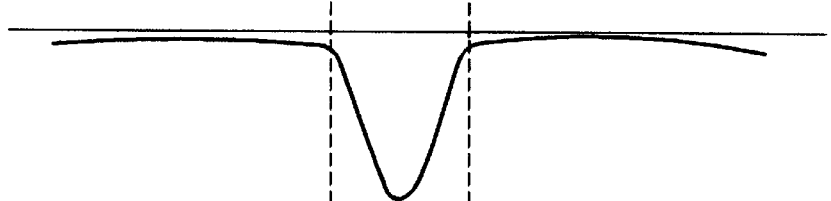
Figure 10C:

FIGS. 10A to 10C show the intensity profile of light and the pattern shape of a photoresist, with respect to the halftone phase shift mask according to the second embodiment of the present invention.

FIG. 10A shows the halftone phase shift mask for forming the overlay monitor key and alignment key patterns according to the second embodiment of the present invention.

Although not shown in FIG. 10A, in the part where the cell pattern is to be formed, only the light-shielding layer 41 is patterned on the substrate 45.

As shown in FIG. 10B, the shifting of light occurs all in the part where the substrate 45 is etched and where the light-shielding layer 41 is formed, so that the sidelobe is not generated.

Accordingly, as shown in FIG. 10C, an unnecessary loss of a photoresist due to exposure light is prevented, and the accurate patterning of the photoresist is achieved.

As described above, the halftone phase shift mask of the presents invention prevents formation of a sidelobe attended by the formation of the overlay monitor key and alignment key patterns. Thus, an accurate pattern for the cell is formed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A halftone phase shift mask, usable to form a plurality of key patterns and a plurality of cell patterns, comprising:
    a substrate;
    a first light-shielding layer formed on the substrate; and
    a second light-shielding layer formed on the substrate and the first light-shielding layer, for shifting a phase of light passing therethrough,
    wherein the first and second light-shielding layers define the key patterns so as to prevent formation of sidelobes near the key patterns.

2. A halftone phase shift mask as claimed in claim 1, wherein the key patterns include an overlay monitor key pattern and an alignment key pattern.

3. A halftone phase shift mask as claimed in claim 2, wherein the first light-shielding layer defines the cell patterns.

4. A halftone phase shift mask as claimed in claim 3, wherein the first light-shielding layer shields the light completely.

5. A halftone phase shift mask as claimed in claim 4, wherein the second light-shielding layer shields the light partially.

6. A halftone phase shift mask as claimed in claim 1, wherein the size of the key patterns is greater than the size of the cell patterns.

7. A halftone phase shift mask, usable to form a plurality of first patterns and a plurality of second patterns, comprising:
    a substrate having a first region for forming the plurality of second patterns and a second region for forming the plurality of first patterns;
    a first light-shielding layer formed on the substrate, excluding the first and second regions; and
    a second light-shielding layer formed on the first light-shielding layer and the substrate for shifting a phase of light passing therethrough,
    wherein the first and second light-shielding layers define the first patterns so as to prevent formation of sidelobes near the first patterns, wherein the first patterns include an overlay monitor key pattern and an alignment key pattern, and the second patterns are cell patterns.

8. A halftone phase shift mask as claimed in claim 7, wherein the substrate is comprised of a light-transmissive material.

9. A halftone phase shift mask as claimed in claim 7, wherein the first light-shielding layer includes chrome (Cr).

10. A halftone phase shift mask as claimed in claim 7, wherein the second light-shielding layer includes any one of CrO, $Cr_2O_5$, CrON, SiN, Wsi, MoSiO and MoSiON.

11. A halftone phase shift mask as claimed in claim 7, wherein the first light-shielding layer shields light completely and a thickness of the second light-shielding layer is controlled, so that a phase of the light transmitting therethrough is shifted and a transmissivity of the second light-shielding layer is approximately 5–10%.

12. A halftone phase shift mask as claimed in claim 7, wherein the first light-shielding layer defines the second patterns.

13. A halftone phase shift mask as claimed in claim 12, wherein each of the first patterns is larger in size than each of the second patterns.

14. A halftone phase shift mask comprising:
 a substrate having a plurality of recesses formed from a surface of the substrate; and
 a light-shielding layer formed on the substrate, excluding the plurality of recesses of the substrate, for shifting a phase of light passing therethrough and defining a plurality of first patterns, wherein a light passing through the recesses having no light-shielding layer thereon defines a plurality of second patterns, and a size of the second patterns is greater than a size of the first patterns.

15. A halftone phase shift mask as claimed in claim 14, wherein the second patterns include an overlay monitor key pattern and an alignment key pattern, and the first patterns include cell patterns.

16. A halftone phase shift mask as claimed in claim 15, wherein widths of the recesses substantially correspond with widths of the overlay monitor key pattern and alignment key pattern.

17. A halftone phase shift mask as claimed in claim 16, wherein the substrate is comprised of a light-transmissive material.

18. A halftone phase shift mask as claimed in claim 16, wherein a thickness of the light-shielding layer is controlled, so that a phase of light being transmitted therethrough is shifted and a transmissivity of the light-shielding layer is approximately 5–10%.

19. A halftone phase shift mask as claimed in claim 16, wherein the light-shielding layer includes any one of CrO, $Cr_2O_5$, CrON, SiN, Wsi, MoSiO and MoSiON.

20. A method of manufacturing a halftone phase shift mask, comprising the steps of:
 forming a first light-shielding layer on a first region of a substrate;
 forming a second light-shielding layer on a second region of the substrate and on the first light-shielding layer, the second light-shielding layer shifting a phase of light passing therethrough; and
 patterning the first and second light-shielding layers to form a plurality of cell patterns and a plurality of key patterns in the first and second regions, whereby the first and second light shielding layers define the key patterns so as to prevent formation of sidelobes near the key patterns.

21. A method of manufacturing the halftone phase shift mask as claimed in claim 20, wherein the step of forming the first light-shielding layer includes the steps of:
 forming the first light-shielding layer on the entire surface of the substrate, and
 selectively removing the first light-shielding layer to form the first region.

22. A method of manufacturing the halftone phase shift mask as claimed in claim 20, wherein the substrate is comprised of either a quartz or glass.

23. A method of manufacturing the halftone phase shift mask as claimed in claim 20, wherein the first light-shielding layer defines the cell patterns, each of the cell patterns being smaller in size than each of the key patterns.

24. A method of manufacturing the halftone phase shift mask as claimed in claim 23, wherein the step of forming the second light-shielding layer includes the steps of:
 forming the second light-shielding layer on the substrate and the first light-shielding layer, and
 selectively removing the first and second light-shielding layers to form the first and second regions.

25. A method of manufacturing the halftone phase shift mask as claimed in claim 24, wherein the step of selectively removing includes the step of:
 simultaneously etching the first and second light-shielding layers to form the second region.

26. A method of manufacturing the halftone phase shift mask as claimed in claim 25, wherein the substrate is comprised of a light-transmissive material.

27. A method of manufacturing the halftone phase shift mask as claimed in claim 25, wherein the first light-shielding layer includes chrome.

28. A method of manufacturing the halftone phase shift mask as claimed in claim 25, wherein the second light-shielding layer is comprised of one of CrO, $Cr_2O_5$, CrON, SiN, Wsi, MoSiO and MoSiON.

29. A method of manufacturing the halftone phase shift mask as claimed in claim 25, wherein the first light-shielding layer shields light completely, and the step of forming the second light-shielding layer includes the step of:
 controlling a thickness of the second light-shielding layer, so that a phase of light transmitting therethrough is shifted and a transmissivity of the second light-shielding layer is approximately 5–10%.

30. A method of manufacturing a halftone phase shift mask, comprising the steps of:
 forming a light-shielding and shifting layer on a substrate;
 patterning the light-shielding and shifting layer to form a first pattern region and a second pattern region; and
 removing a surface of the substrate corresponding to the second pattern region to a predetermined depth and forming recesses thereon, wherein a light passing through the recesses having no light-shielding and shifting layer thereon defines a plurality of second patterns, and a size of the second patterns is greater than a size of first patterns defined by the first pattern region.

31. A method of manufacturing the halftone phase shift mask as claimed in claim 30, wherein the second patterns include an overlay monitor key pattern and an alignment key pattern, and the first patterns include cell patterns.

32. A method of manufacturing the halftone phase shift mask as claimed in claim 31, wherein the forming step includes the step of:
 controlling a thickness of the light-shielding layer, so that a phase of light transmitting therethrough is shifted and a transmissivity of the light-shielding and shifting layer is approximately 5.10%.

33. A method of manufacturing the halftone phase shift mask as claimed in claim 32, wherein the light-shielding and shifting layer is comprised of any one of CrO, $Cr_2O_5$, CrON, SiN, WSi, MoSiO and MoSiON.

34. A method of manufacturing the halftone phase shift mask as claimed in claim 33, wherein the substrate is comprised of a light-transmissive material.

35. A method of manufacturing the halftone phase shift mask as claimed in claim 34, wherein the light-transmissive material includes one of quartz and glass.

* * * * *